US012085665B2

(12) United States Patent
Pink et al.

(10) Patent No.: US 12,085,665 B2
(45) Date of Patent: Sep. 10, 2024

(54) METHOD FOR DESIGNING A SENSOR ARRANGEMENT FOR A VEHICLE

(71) Applicant: Robert Bosch GmbH, Stuttgart (DE)

(72) Inventors: Oliver Pink, Ditzingen (DE); William Charles Degutis, Leinfelden (DE); Mark Janos Dobranszky, Szigetszentmiklós (HU)

(73) Assignee: ROBERT BOSCH GMBH, Stuttgart (DE)

( * ) Notice: Subject to any disclaimer, the term of this patent is extended or adjusted under 35 U.S.C. 154(b) by 489 days.

(21) Appl. No.: 17/395,905

(22) Filed: Aug. 6, 2021

(65) Prior Publication Data
US 2022/0050169 A1   Feb. 17, 2022

(30) Foreign Application Priority Data
Aug. 14, 2020   (DE) .......................... 102020210345.3

(51) Int. Cl.
| | |
|---|---|
| *G01S 7/02* | (2006.01) |
| *B60W 30/00* | (2006.01) |
| *B60W 60/00* | (2020.01) |
| *G01S 7/40* | (2006.01) |
| *G01S 13/931* | (2020.01) |

(52) U.S. Cl.
CPC ............ *G01S 7/027* (2021.05); *B60W 30/00* (2013.01); *G01S 7/4004* (2013.01); *G01S 13/931* (2013.01); *B60W 60/001* (2020.02); *B60W 2420/403* (2013.01); *B60W 2420/408* (2024.01); *B60W 2420/54* (2013.01)

(58) Field of Classification Search
CPC ...... G01S 7/027; G01S 7/4004; G01S 13/931; G01S 15/931; B60W 30/00; B60W 60/001; B60W 2420/408; B60W 2420/403; B60W 2420/54; G06V 20/56
See application file for complete search history.

(56) References Cited

U.S. PATENT DOCUMENTS

| 11,334,762 | B1 * | 5/2022 | Wrenninge | .......... G06V 10/774 |
| 2019/0322285 | A1 * | 10/2019 | Lagre | ................... G05D 1/0088 |
| 2021/0097147 | A1 * | 4/2021 | DeVore | .................... G06F 18/22 |
| 2021/0131838 | A1 * | 5/2021 | Pinkelman | ............. G01S 7/4086 |
| 2022/0342066 | A1 * | 10/2022 | Burger | .................... G01S 13/58 |

FOREIGN PATENT DOCUMENTS

| DE | 102007062039 A1 | 6/2009 |
| DE | 102009044230 A1 * | 4/2011 | ............. G01S 15/87 |

OTHER PUBLICATIONS

17395905_2024-02-28_DE_102009044230_A1_M.pdf, machine translation of DE-102009044230-A1 (Year: 2011).*

* cited by examiner

*Primary Examiner* — Timothy A Brainard
*Assistant Examiner* — Kenneth W Good
(74) *Attorney, Agent, or Firm* — NORTON ROSE FULBRIGHT US LLP; Gerard A. Messina

(57) ABSTRACT

A method for designing a sensor arrangement, in particular for a vehicle or a vehicle class. Dimensions of vehicles of at least one vehicle class are ascertained and geometric parameters are ascertained from the dimensions of the vehicles of the vehicle class. Predefined reference fields for sensors of vehicles of the at least one vehicle class are established based on the derived geometric parameters. Each reference field is configured to accommodate at least one sensor. A sensor arrangement is also described.

5 Claims, 1 Drawing Sheet

METHOD FOR DESIGNING A SENSOR ARRANGEMENT FOR A VEHICLE

CROSS REFERENCE

The present application claims the benefit under 35 U.S.C. § 119 of German Patent Application No. DE 102020210345.3 filed on Aug. 14, 2020, which is expressly incorporated herein by reference in its entirety.

FIELD

The present invention relates to a method for designing a sensor arrangement, in particular for a vehicle or a vehicle class. Furthermore, the present invention relates to a sensor arrangement, for example, a sensor arrangement designed as a sensor architecture.

BACKGROUND INFORMATION

In the manufacture of vehicles, the provided sensors and the corresponding E/E architecture are adapted individually to a vehicle design. The positions of the sensors are specified by the vehicle manufacturer, whereby the sensor architecture and the E/E architecture have to be subjected to a test and release in each developed vehicle. Such a procedure results in increased expenditure in the verification and validation of the particular architectures or systems.

Automated driving functions increase the development costs in vehicle development. In particular, the verification and validation of the sensor architecture for providing automated driving functions is costly and may make up 30% to 40% of the total development costs. To be able to successfully offer vehicles including automated driving functions to a large number of potential customers, it is essential to reduce costs for implementing the sensor architecture. The development costs of the vehicle and thus also the vehicle price may be reduced by reducing the costs for implementing the sensor architecture.

SUMMARY

An object of the present invention is to provide a method and a sensor arrangement for vehicles operable in an automated manner which may reduce the costs for systems for automated driving.

This object may achieved with the aid of the particular subject matter of an example embodiment of the present invention. Advantageous designs and example embodiments of the present invention disclosed herein.

According to one aspect of the present invention, a method is provided for designing a sensor arrangement for a vehicle and/or a vehicle class. The sensor arrangement may be designed, for example, as a sensor architecture.

In one step, dimensions of vehicles of at least one vehicle class are ascertained and geometric parameters are derived from the dimensions of the vehicles of the vehicle class.

Based on the derived geometric parameters, predefined reference fields for sensors of vehicles of the at least one vehicle class are established, each reference field being configured to accommodate at least one sensor. The at least one reference field may be fixedly or statically designed for the particular sensor arrangement. In particular, a specific sensor type may preferably be able to be situated in or at the reference field.

The at least one reference field may be optimally established or defined for a sensor type for this purpose.

The geometric parameters are not only dependent on the dimensions of the vehicles of a vehicle class. Rather, further factors, for example, the type of the vehicle paint, thickness of the vehicle paint, transmissivity of the vehicle windows for certain wavelengths, and the like may influence the geometric parameters. In this way, for example, a height of the geometric parameters may also exceed a vehicle height to be able to attach sensors on the vehicle roof directly or with the aid of fastening adapters.

According to one exemplary embodiment, at least one reference field of the established reference fields is equipped with at least one sensor to form the sensor arrangement.

The sensor arrangement may preferably be used in vehicles which may be operable in an assisted, semi-automated, highly-automated, and/or fully-automated or driverless manner according to the BASt norm.

Such vehicles may be designed, for example, as a passenger car, a truck, a robotaxi, shuttles, and the like. The vehicle is not restricted to operation on roads. Rather, the vehicle may also be designed as a watercraft, an aircraft, for example, a transport drone, a helicopter, an airplane, and the like.

The sensor arrangement thus includes fixed position windows or reference fields, which are used to accommodate sensors. The reference fields may be derived from the geometric parameters. The geometric parameters may preferably be taken from one or multiple vehicles of one or multiple manufacturers, so that the reference fields are usable for a maximum possible number of different vehicles.

The geometric parameters may include vehicle dimensions, for example, vehicle width, vehicle length, and vehicle height, height of the headlights, position and dimension of the windshield and/or the rear window, tire arrangement, wheelbase, dimensions of the passenger compartment, and the like.

The geometric positions may form a mean value made up of a plurality of different vehicles of a vehicle class.

Optimized positions for sensors may be ascertained from the geometric parameters. For example, a position for a radar sensor may be provided in the area of the vehicle front. A LIDAR sensor may preferably be situated in the area of the windshield or on the vehicle roof. Ultrasonic sensors may be positioned in the front area and in the rear area of the vehicle. The explicit position of the possible sensors and sensor types may be derived from the geometric parameters and established in the form of reference fields.

An arrangement or distribution of the reference fields along geometric parameters of a vehicle class may preferably be used in the form of an optional sensor arrangement in a plurality of vehicles.

The sensor arrangement including the reference windows may be validated and verified once for a vehicle class, component checks and approval procedures also being possible for the sensor architecture. Subsequently, the initially approved sensor architecture may be validated and verified with reduced additional expenditure for different vehicles. The vehicle costs may be reduced by the reduced expenditure during the verification and validation of the sensor arrangement.

If the sensor arrangement having the established distribution of the sensors at the reference fields is used by vehicle manufacturers, vehicles including automated driving functions may be manufactured more cost-effectively. In particular, there is no compulsion on the part of the vehicle manufacturers to equip all reference fields with sensors. Different reference fields may be equipped with sensors in different equipment versions.

For example, all available reference fields may be equipped in vehicles operable in a highly-automated and/or fully-automated or driverless manner. In a vehicle operable in a semi-automated manner, the reference fields may be proportionally equipped with sensors, for example. For this reason, the sensor arrangement may be used for different vehicles and different equipment variations.

A vehicle design may preferably be carried out in consideration of the sensor arrangement and the reference fields along the geometric parameters. In this way, an individual and untested arrangement of sensors may be avoided and the already validated and verified sensor arrangement may be used.

In one specific embodiment of the present invention, the sensor arrangement and its geometric positioning options are specifically designed for the at least one vehicle class. Different vehicle classes, for example, compact cars, medium-sized cars, luxury class cars, transporters or vans, pickups, or SUVs are already known. The vehicles of the same vehicle class of different manufacturers have a negligible size deviation from one another. In this way, specific geometric parameters and reference fields may be ascertained per vehicle class.

The reference fields or an arrangement of the reference fields along the geometric parameters may subsequently be used as a basis for one or multiple configurations of the sensor arrangement.

For example, the provided reference fields may be equipped completely or partially with sensors to enable different equipment variants having different degrees of automation of automated driving functions. The design freedom in the design and manufacturing of the vehicle may be maximized by this measure.

According to another exemplary embodiment of the present invention, the reference fields are established specifically depending on sensor type as a function of dimensions and positions of the reference fields. A specific sensor type may be usable in the reference fields, for example, depending on the size of the reference fields. For example, sensors having larger dimensions may only be used in correspondingly large-dimensioned reference fields.

One reference field may accommodate one or multiple sensors, however, a reference field may also remain without sensors.

In particular, reference fields may be provided specifically for radar sensors, LIDAR sensors, camera sensors, ultrasonic sensors, and the like. A sensor may be situated centrally, laterally, pivoted arbitrarily, and the like within a reference field.

In particular, according to another specific embodiment of the present invention, a dimension and a position of the at least one reference field are adapted to requirements of a sensor type. For example, the reference field may include a receptacle surface and/or a receptacle window. For an ultrasonic sensor, the receptacle window may have a width of less than 2 cm. In the case of a LIDAR sensor or a camera sensor, a larger receptacle window or a larger receptacle surface may be necessary. For example, for a LIDAR sensor, a square receptacle surface may be provided as a reference field on a vehicle roof having a side length of for example, 20 cm. The reference field may have a fixed height corresponding to the idealized or averaged vehicle height or may have an established height range of, for example, ±15 cm.

Based on the association of the sensor types with specific reference fields, interactions between the sensors may be checked and precluded beforehand.

According to another exemplary embodiment of the present invention, a vehicle contour is mapped for each vehicle class at least in areas by the derived geometric parameters and at least one reference field is established along the vehicle contour. An idealized and optimized vehicle may be geometrically created by this measure, which covers or reflects most vehicles of different manufacturers of the same vehicle class with respect to the dimensions.

According to another specific embodiment of the present invention, the sensor arrangement is checked, assessed, and/or authorized for the vehicle class. In this way, a sensor arrangement may be used with arbitrary vehicles and vehicle manufacturers after a single validation and verification. An additional or later validation expenditure and verification expenditure of the sensor arrangement may thus be significantly reduced since no individualized arrangement of sensors takes place.

According to another exemplary embodiment of the present invention, the sensor arrangement including the predefined reference fields is used as the basis for at least one vehicle design.

A reference field may preferably be a predefined volume or a predefined area which is suitable for accommodating a sensor. Multiple reference fields have an established shape, size, position, and relative alignment in relation to one another. The reference fields may be equipped with sensors, but may also remain empty or unused depending on an equipment variant of the vehicle.

A predefined reference field is in particular a pre-specified, previously established, or predetermined reference field, which is established once, for example, for the geometrical parameters and forms the foundation for the sensor arrangement and the positioning of the sensors.

The vehicle design may build on the already checked and authorized sensor arrangement and thus use the advantages of a cost-effective validation and verification. The costs of automating the vehicle may also be reduced by the more cost-effective validation and verification. In particular, instead of a validation and verification of a sensor arrangement for each vehicle, a validation and verification may be implemented for a comprehensive vehicle class to reduce costs.

According to another specific embodiment of the present invention, at least one LIDAR sensor, a radar sensor, an ultrasonic sensor, and/or at least one camera sensor are inserted into the at least one reference field. In this way, the sensor arrangement may be designed for a plurality of different sensors and degrees of automation.

According to another exemplary embodiment of the present invention, the reference field is established as a position point, a position area, or a position volume for accommodating at least one sensor. In particular, the reference field may include an uncertainty range or a variable range which enables an additional design freedom in the design of the vehicle. Due to this measure, the sensor arrangement may be used in a flexible and versatile manner in a plurality of different vehicles.

According to another specific embodiment of the present invention, the at least one reference field for accommodating at least one sensor is established having at least one sensor orientation. The sensor orientation may be designed in the form of a specification for an alignment of the sensor usable in the reference field. In particular, the sensor orientation may be designed as a defined emission direction or alignment or as an angle range. The sensor orientation may be defined along at least one dimension for this purpose.

In a further embodiment of the present invention, maximum vehicle dimensions, minimum vehicle dimensions, and/or average vehicle dimensions of vehicles of different manufacturers of a vehicle class are ascertained to determine the geometric parameters, a distribution of reference fields being established on the basis of the geometric parameters, which is usable specifically for the vehicles of the vehicle class. In this way, idealized geometric parameters may be ascertained, by which the predefined reference fields are usable for a plurality of vehicles of different manufacturers.

The reference fields may preferably have a dimension in at least one spatial direction, by which differences between dimensions of vehicles of different manufacturers may be compensated for.

According to another specific embodiment of the present invention, the sensor arrangement and the positions of the reference fields are derived from requirements of a driver assistance function of the vehicle. In this way, a sensor arrangement adapted optimally to the driver assistance function to be used may be provided.

According to another exemplary embodiment of the present invention, the sensor arrangement and the geometric positioning of the reference fields are derived based on properties of the sensors. The properties of the sensors, for example, sampling area, range, alignment, dimensions of the sensors, and the like may be taken into consideration in the establishment of the position and the dimension of the reference fields.

According to a further aspect of the present invention, a sensor arrangement is provided, which may be designed in particular as a sensor architecture. In accordance with an example embodiment of the present invention, the sensor arrangement includes at least one predefined reference field for accommodating at least one sensor, the sensor arrangement being checked and authorized beforehand, and the sensor arrangement being usable vehicle-comprehensively in vehicle development.

The sensor arrangement may be usable here in a vehicle type-comprehensive and/or vehicle manufacturer-comprehensive manner.

The vehicle design may be created starting from the sensor arrangement due to an early incorporation of vehicle manufacturers. The geometric relations and parameters of the sensor arrangement and the reference fields of the sensor arrangement may thus be maintained, so that repeated validation and verification of the sensor arrangement is dispensed with or significantly reduced. The sensor arrangement may be validated and verified beforehand, preferably completely equipped with sensors.

At the same time, the sensor arrangement may be used for different equipment variants. For a reduced degree of automation, the reference fields of the sensor arrangement may be partially equipped with sensors. With a higher degree of automation, additional sensors may be inserted into the free reference fields.

Preferred exemplary embodiments of the present invention are explained in greater detail hereinafter on the basis of greatly simplified schematic representations.

DETAILED DESCRIPTION OF EXAMPLE EMBODIMENTS

Figure 4:
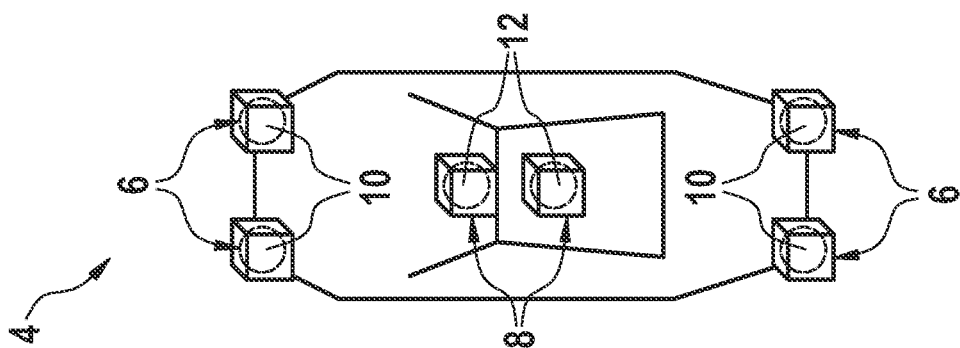
FIG. 4 shows a schematic top view of a sensor arrangement completely equipped with sensors according to one specific embodiment of the present invention.
Figure 3:
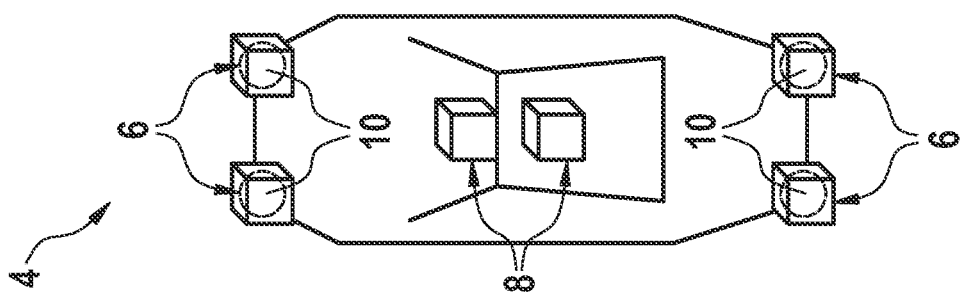
FIG. 3 shows a schematic top view of a sensor arrangement partially equipped with sensors according to one specific embodiment of the present invention.
Figure 1:
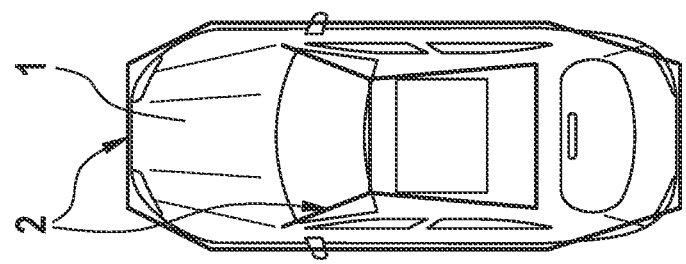
FIG. 1 shows a schematic top view of a vehicle including ascertained geometric parameters to illustrate a method according to one specific embodiment of the present invention.

A schematic top view of a vehicle 1 including ascertained geometric parameters 2 is shown in FIG. 1. FIGS. 1 through 4 are used in particular to illustrate a method for designing a sensor arrangement 4. FIGS. 3 and 4 show exemplary sensor arrangements 4.

FIG. 1 shows a step in which dimensions of vehicle 1 of a vehicle class are ascertained and geometric parameters 2 are derived from the dimensions of vehicle 1 of the vehicle class. Vehicle 1 shown is used solely as an example. Geometric parameters 2 of multiple vehicles 1 of different manufacturers of a vehicle class may preferably be ascertained to form a mean value. Idealized geometric parameters 2 may be ascertained for the particular vehicle class. In the illustrated exemplary embodiment, vehicle 1 is designed as a medium-sized car.

Geometric parameters 2 are schematically shown as lines and for the sake of clarity map the external vehicle contours and a roof shape of vehicle 1.

Figure 2:
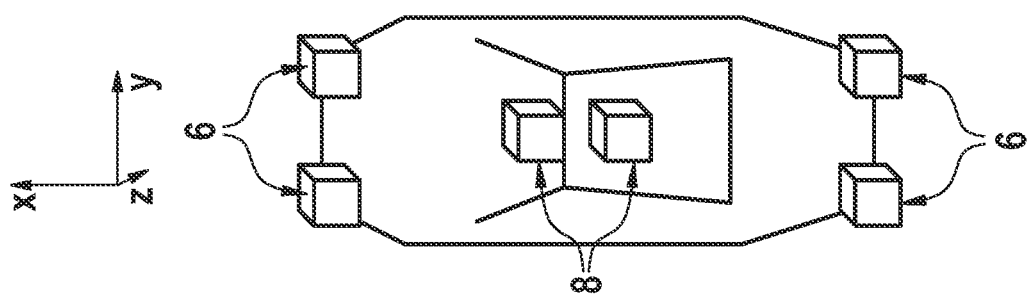
FIG. 2 shows a schematic top view of the ascertained geometric parameters including associated reference fields to illustrate the method, in accordance with an example embodiment of the present invention.

A schematic top view of ascertained geometric parameters 2 including associated reference fields 6, 8 is shown in FIG. 2. Reference fields 6, 8 are established based on derived geometric parameters 2 for one or multiple sensor types 10, 12. The volumes may have an extension in each spatial direction x, y, z. The volumes of reference fields 6, 8 may include identical or different dimensions.

Reference fields 6, 8 are designed in the form of volumes in the illustrated exemplary embodiment, so that a sensor 10, 12 may be situated inside the volume of reference fields 6, 8 by a manufacturer.

Each reference field 6, 8 is configured to accommodate at least one sensor 10, 12. The at least one reference field 6, 8 may be designed fixedly or statically for particular sensor arrangement 4. In particular, a certain sensor type may preferably be able to be situated in or at reference field 6, 8. For this purpose, the at least one reference field 6, 8 may be established or defined, optimized for a sensor type.

For example, an established reference field 8 may be provided on a windshield or on a vehicle roof to accommodate camera sensors or LIDAR sensors 12.

Reference fields 6 established on a vehicle front and on a vehicle rear may be provided for positioning ultrasonic sensors or radar sensors 10.

FIG. 3 shows a schematic top view of a sensor arrangement 4 partially equipped with sensors 10 according to one specific embodiment. Exemplary reference fields 6 in the vehicle rear and the vehicle front are equipped with sensors 10. Exemplary reference fields 8 on the vehicle roof and the vehicle windshield are not provided with sensors. In this way, a sensor arrangement 4 or a sensor architecture may be provided for a vehicle 1 operated in a manual or semi-automated manner.

Reference fields 6 are equipped in the exemplary embodiment shown with sensors 10, for example, radar sensors and/or ultrasonic sensors.

FIG. 4 shows a schematic top view of a sensor arrangement 4 completely equipped with sensors 10, 12 according to one specific embodiment. Sensor arrangement 4 may represent an enhanced equipment variant here and may be configured, for example, for vehicles 1 operable in a fully-automated manner. In the illustrated exemplary embodiment, reference fields 8 on the vehicle roof and the windshield are also equipped with sensors 12, for example, camera sensors and/or LIDAR sensors.

The variants of sensor arrangement 4 shown in FIG. 3 and FIG. 4 may be used for the corresponding vehicle class with a plurality of vehicles of different vehicle manufacturers.

Sensor arrangement 4 may be validated and verified once, component checks and authorization procedures for sensor arrangement 4 also being possible. Subsequently, initially authorized sensor arrangement 4 may be used in different vehicles 1 with a reduced validation expenditure and verification expenditure.

What is claimed is:

1. A method for designing a sensor arrangement for a vehicle or a vehicle class, the method comprising the following steps:
    ascertaining and applying to a plurality of vehicles a same set of dimensions, wherein the plurality of vehicles are of different types that (a) differ from one another with respect to actual dimensions and (b) are classified as being of a same single vehicle class;
    based on the classification as being of the same single vehicle class, ascertaining a same set of geometric parameters from the ascertained set of dimensions;
    establishing, for all of the plurality of vehicles and based on the ascertained geometric parameters, a same set of associations of predefined reference fields, each of the associations being with a respective spatial region defined relative to the ascertained geometric parameters, the associations forming a same distribution of the predefined reference fields for all of the plurality of vehicles;
    according to the establishment of the associations, inserting, for each of the plurality of vehicles, respective ones of a plurality of sensors into a respective one or more of the associated predefined reference fields; and
    subsequent to the insertion, for each of one or more of the plurality of vehicles, modifying placement of one or more of the sensors that have been inserted into one or more of the associated predefined reference fields;
    wherein the respective ones of the plurality of sensors includes one or more of a LIDAR sensor, a radar sensor, an ultrasonic sensor, and a camera.

2. The method as recited in claim 1, wherein different ones of the reference fields have different dimensions than one another according to requirements of different types of sensors that are able to be accommodated in different ones of the reference fields.

3. The method as recited in claim 1, wherein a vehicle contour is mapped at least in some areas by the ascertained geometric parameters, the establishment of the associations of the predefined reference fields being a placement of the reference fields along the vehicle contour.

4. The method as recited in claim 1, wherein the dimensions that are ascertained are maximum vehicle dimensions of the plurality of vehicles and/or minimum vehicle dimensions of the plurality of vehicles and/or average vehicle dimensions of the plurality of vehicles.

5. The method as recited in claim 1, wherein the respective sensors that are inserted differ, between different ones of the plurality of vehicles, with respect to at least one of type and position based on differences between the plurality of vehicles with respect to respective requirements of a driver assistance function of the respective vehicles.

* * * * *